US012699152B2

(12) United States Patent
Negri

(10) Patent No.: US 12,699,152 B2
(45) Date of Patent: Aug. 4, 2026

(54) BUSHING AND A METHOD FOR MONITORING OF THE BUSHING

(71) Applicant: HSP HOCHSPANNUNGSGERÄTE GMBH, Troisdorf (DE)

(72) Inventor: Fabrizio Negri, Nuremberg (DE)

(73) Assignee: HSP Hochspannunsgeräte GmbH, Troisdorf (DE)

( * ) Notice: Subject to any disclaimer, the term of this patent is extended or adjusted under 35 U.S.C. 154(b) by 151 days.

(21) Appl. No.: 18/697,228

(22) PCT Filed: Oct. 1, 2021

(86) PCT No.: PCT/EP2021/077059
§ 371 (c)(1),
(2) Date: Mar. 29, 2024

(87) PCT Pub. No.: WO2023/051931
PCT Pub. Date: Apr. 6, 2023

(65) Prior Publication Data
US 2024/0319291 A1 Sep. 26, 2024

(51) Int. Cl.
*G01R 29/20* (2006.01)
*G01R 31/12* (2020.01)
*G01R 31/62* (2020.01)
*H01B 17/00* (2006.01)
*H01B 17/28* (2006.01)

(52) U.S. Cl.
CPC ......... *G01R 31/62* (2020.01); *G01R 31/1245* (2013.01); *H01B 17/005* (2013.01); *H01B 17/28* (2013.01)

(58) Field of Classification Search
CPC .... G01R 31/1245; G01R 31/62; H01B 17/28; H01B 17/005
See application file for complete search history.

(56) References Cited

U.S. PATENT DOCUMENTS

| | | | | |
|---|---|---|---|---|
| 6,489,782 B1 * | 12/2002 | Baier | ................. | G01R 31/1245 324/544 |
| 6,927,562 B2 * | 8/2005 | Anand | ............... | G01R 27/2688 324/126 |
| 7,126,348 B2 * | 10/2006 | Adolfsson | .............. | G01R 15/16 324/658 |

(Continued)

FOREIGN PATENT DOCUMENTS

DE          10012068 A1     10/2001

OTHER PUBLICATIONS

Peres et al., "Field Experience with On-Line Bushing Monitor-ing in HVDC System at Ibiuna Substation", 2009.

(Continued)

*Primary Examiner* — Thang X Le

(74) *Attorney, Agent, or Firm* — Laurence A. Greenberg; Werner H. Stemer; Ralph E. Locher

(57) ABSTRACT

A bushing and a method for monitoring the bushing. The bushing is a high-voltage DC bushing with a test tap. The high-voltage DC bushing arrangement includes a monitoring device configured to inject a voltage and/or current pulse signal via the test tap and to detect and process a corresponding response signal. There is also described a method for operating an HVDC bushing, an HVDC transformer, and a converter arrangement with the bushing.

12 Claims, 3 Drawing Sheets

(56) References Cited

U.S. PATENT DOCUMENTS

| | | | | |
|---|---|---|---|---|
| 2002/0011848 A1* | 1/2002 | Coffeen | ................. | G01R 31/62 |
| | | | | 324/547 |
| 2007/0029896 A1* | 2/2007 | Ha | ......................... | H02N 2/008 |
| | | | | 310/317 |
| 2008/0309351 A1* | 12/2008 | Stewart | .............. | G01R 31/1272 |
| | | | | 324/551 |
| 2011/0234243 A1* | 9/2011 | Santos | ............... | G01R 31/1227 |
| | | | | 324/659 |
| 2014/0368215 A1* | 12/2014 | Hoffman | ................ | G01R 15/16 |
| | | | | 324/552 |
| 2016/0154051 A1* | 6/2016 | Watson | .............. | G01R 31/1272 |
| | | | | 324/552 |
| 2020/0336079 A1* | 10/2020 | Doering | ............. | H05K 7/14339 |

OTHER PUBLICATIONS

Setayeshmehr A et al: "On-line monitoring and diagnoses of power transformer bushings"; IEEE Transactions on Dielectrics and Electrical Insolation, IEEE Service Center, Piscataway, NJ, US, vol. 13, No. 3, Jul. 17, 2006; pp. 608-615; XP008119554; ISSN: 1070-9878; DOI: 10.1109/TDEI.2006.1657975.
Edilson, Peres G. et al.: "Field Experience With On-Line DC Bushing Monitoring in HVDC System at Ibiuna Substation"; Jan. 1, 2009; pp. 1-8; XP055109412.
Xiao Yao et al: "A Monitoring Scheme for UHV Wall Bushing"; 2018 International Conference on Power System Technology (Powercon), IEEE; Nov. 6, 2018 (Nov. 6, 2018), pp. 4650-4654; XP033492392; DOI: 10.1109/POWERCON.2018.8602219.

* cited by examiner

BUSHING AND A METHOD FOR MONITORING OF THE BUSHING

FIELD AND BACKGROUND OF THE INVENTION

The present invention relates to a high-voltage DC bushing arrangement comprising a high-voltage DC bushing with a test or voltage tap.

The general purpose of a bushing is to allow an electrical conductor to pass through a conducting barrier such as a grounded wall or a housing of a transformer or a circuit breaker without an electrical flashover. High-voltage bushings are suitable to withstand the electrical field strength corresponding to voltages above 1 kV, and especially above 100 kV. They can thus be installed in high-voltage arrangements like e.g. HVDC systems. High-voltage DC (HVDC) bushings and high-voltage AC bushings are different due to the respective properties of the conducted current type. In particular, high-voltage DC bushings must be suitable for applications in systems with a considerable DC current/voltage portion of the conducted current. Some of the differences between AC and DC bushings are analyzed and described in X. Chen et al., "Electrical Properties Calculation of HVDC Bushing", 2010 Annual Report Conference on Electrical Insulation and Dielectric Phenomena.

High-voltage bushings, in particular capacitance graded bushings, may be provided with a test tap. The test tap can be also implemented by a voltage tap with integrated test tap functionality. A voltage tap is normally intended for use as a voltage divider during normal operation and may require the use of additional capacitance to limit the output voltage and protective devices e.g. mounted directly to the bushing. A test tap is intended for measurement of dissipation factor, capacitance from conductor to tap, and partial discharge on the field. The test tap is moreover designed to allow the testing of the bushing in the factory, therefore being usually grounded. Since the capacitance from tap to ground is not controlled, the tap is not necessarily intended for use as a voltage divider during normal operation. When not in use, the voltage and test taps are usually effectively grounded.

FIG. 1 schematically shows an exemplary application of HVDC bushings in an HVDC VSC converter system 1. The converter system 1 comprises a converter 2 being a modular multi-level converter (MMC). The MMC comprises converter valves 3, 4, each arranged between an AC terminal 5 and one of two DC terminals 6, 7. The MMC is connected, via its AC terminal 5 and a converter transformer T, with an AC network 8. An AC filter unit 9 is arranged on the converter side of the converter transformer T. The converter valves 3, 4 of the MMC are located within a valve hall 10. To connect the series circuits of switching modules SM with smoothing reactors L located outside the valve hall 10, corresponding conductors are fed through a wall of the valve hall 10 via respective converter bushings 11, 12.

On the DC side of the MMC 2, the converter valve 3 is connected with a DC overhead line 13 (e.g. of positive polarity) via a first DC side bushing 14. Correspondingly, the converter valve 4 is connected with a grounded DC pole 15 via a second DC side bushing 16. Both, the converter bushings 11, 12, and the DC side bushings 14, 16, are high-voltage DC bushings in the sense of the present invention. The present invention can also be applied to the transformer bushings on the converter side of the Transformer T (not shown in the figure), which also are considered high-voltage DC bushings in the sense of the present invention. Even in presence of the filter unit 9, the voltage applied on the transformer bushings contains an AC and a DC component. For HVDC installations like the one shown in FIG. 1, the bushings are especially designed so that they are suitable for an alternating voltage, surge voltages as well as a stationary DC voltage. In particular, the bushings are exposed to DC voltages to ground. In general, the voltage stress withstand capability of the bushings is to be specified depending on their location and configuration of the HVDC system. The DC side bushing 14 in FIG. 1 is mainly exposed to direct voltage and direct current, with a small amount of voltage and current harmonics.

Each of the converter valves 3, 4 comprises a series circuit of switching modules SM. According to the example of FIG. 1 the switching modules SM are half-bridge modules.

It is well known that a continuous monitoring of a bushing can increase its reliability, including its operating life.

A monitoring method for a high-voltage bushing is known from the EP 3 715 881 A1.

Peres et al., "Field Experience with On-Line Bushing Monitoring in HVDC System at Ibiuna Substation", 2009, describe an application of a monitoring system used in AC bushings to DC bushings.

SUMMARY OF THE INVENTION

The object of the present invention is therefore to provide an aforementioned high-voltage DC bushing arrangement as reliable as possible.

This object is achieved by a high-voltage DC bushing arrangement as claimed.

In accordance with the invention the high-voltage DC bushing arrangement comprises a monitoring means configured to inject a voltage and/or current pulse signal via the test or voltage tap (in the following generally referred to as tap) and to detect and process a corresponding response signal. In accordance with the teaching of the present invention a perturbation is applied to the system, whereas the system information contained in the response signal is examined. The DC bushing according to the present invention allows an efficient and effective monitoring of its status and health, thereby increasing the reliability of the DC bushing. It is understood that applying a combination of voltage/current pulses and analyzing a corresponding combined response signal also lies within the scope of the present invention.

Preferably, the monitoring means comprises a pulse generator configured to generate said voltage and/or current pulse signal. The pulse generator is functionally connected with the tap. The pulse generated by the pulse generator can be injected into the tap. The response signal can be received using a separate link. Alternatively, the injected and the response signal can both be transmitted via a common link. The monitoring means can further comprise a receiving module for receiving and processing the response signal.

According to an embodiment of the invention the voltage and/or current pulse signal has a predetermined frequency distribution. Accordingly, the information about the bushing status can be extracted from the corresponding system frequency response.

Preferably, said voltage and/or current pulse signal comprises frequencies in the range between 30 Hz and 100 KHz.

According to an embodiment of the invention the monitoring means further comprises an (at least one) induction element in parallel to said pulse generator. In a simplified representation the DC bushing can be represented as a capacitance C between the corresponding HV line and the ground. The tap is then a pin dividing C into two partial capacitances C1 between the HV line and the tap and C2 between the tap and ground. Accordingly, the pulse generator is arranged as a parallel branch to C2. Usually, C2 is much larger than C1 (several thousands of pF compared to tens of pF). Being C2>>C1, the current or voltage pulse generated by the generator could skip capacitance C1 and close to ground directly via C2 at the tap (this happens because of the higher the capacitance, the lower the impedance). The parallel induction element effectively helps to avoid this. One can also apply different induction elements in parallel, to cut off different frequencies, for instance if a sinusoidal pulse is applied.

The induction element preferably has an induction value Lg which is chosen such that the impedance of a parallel circuit given by the inductance element and a parallel capacitance of the bushing is substantially maximal for a signal frequency of said pulse signal. This can particularly be done by calculate Lg such that the impedance of the parallel circuit C2∥Lg tends to infinity (this happens when $f=1/(2\pi sqrt\ (Lg\ C2))$).

According to a preferred embodiment of the invention the DC bushing further comprises an inner conductor, an insulating body that surrounds the inner conductor along its longitudinal direction, and comprising, insulating layers configured from a synthetic material or paper that is impregnated with a resin, and electrically conductive control inserts for field control, said control inserts being arranged in a concentric manner around the inner conductor, and spaced apart from one another by means of the insulating layers. Such capacitive control bushing provides particularly smooth field distribution and is therefore particularly effective and reliable. The test or voltage tap is preferably connected with one of said control inserts.

Another object of the present invention is to provide a method for operating a DC bushing arrangement comprising a high-voltage DC bushing with a test or a voltage tap which allows a most reliable operation of said bushing arrangement.

This object is achieved by a method as claimed. According to the invention, the method comprises the steps of injecting a voltage and/or current pulse signal via said tap of the DC bushing, detecting and processing a corresponding response signal, comparing the response signal with a predetermined calibrated reference signal, and providing a bushing status information based on said comparison.

Preferably, the response signal is frequency analyzed. The analysis may for example comprise a Fourier analysis of the response signal.

The resulting pulse is preferably decomposed by means of the Fourier analysis to obtain (extract) its frequency components. For every frequency component a related impedance is derived. For every frequency component (e.g. Hertz by Hertz) we can extract the related impedance (Z=V/I, per each frequency count). In this way, the corresponding impedance in the frequency domain can be derived. The impedance obtained in this way can be compared with reference lines coming from either tests or literature. Depending on the matching of the baseline with the measurement, inference on the status of the bushing can be made.

Another object of the present invention is to provide an HVDC transformer as reliable as possible.

This object is achieved by a transformer as claimed.

Yet another object of the present invention is to provide a converter arrangement as reliable as possible.

This object is achieved by a method as claimed. The converter arrangement according to the invention comprises a converter (e.g. an HVDC converter) with a first converter component located within a valve hall and a second converter component located outside said valve hall, wherein said first and said second components are electrically connected via at least one high-voltage DC bushing arrangement according to the present invention. The converter can be an MMC as described above. The first converter component can be a converter valve with a series of switching modules. The second converter component can be for example an HVDC transformer, a smoothing reactor, a DC terminal or any other component outside the valve hall.

In the following the present invention is explained in more detail in accordance with an embodiment shown in FIGS. 2 and 3.

DETAILED DESCRIPTION OF THE INVENTION

Figure 1:
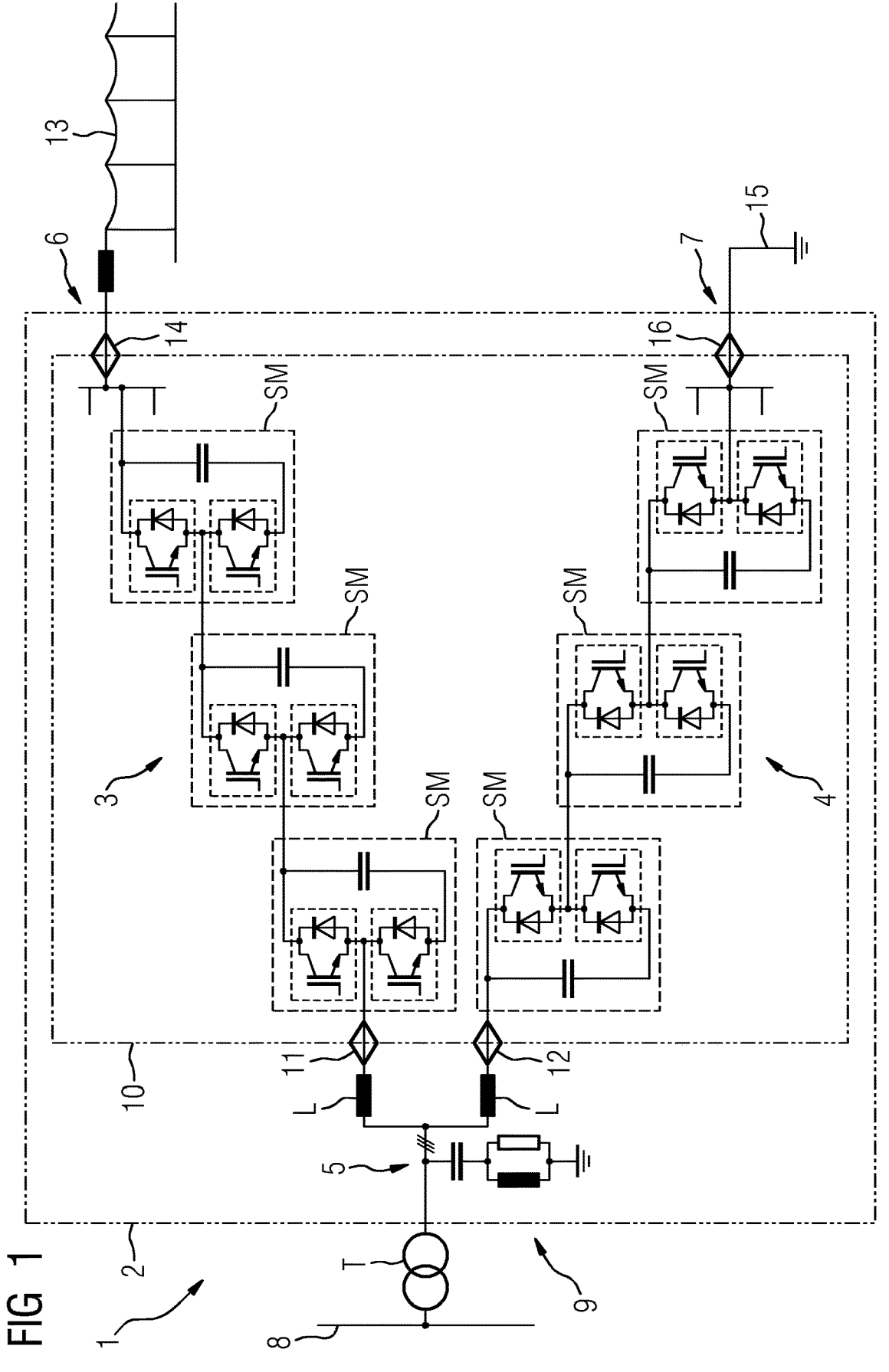
FIG. 1 shows a schematic illustration of an exemplary application of HVDC bushings in an HVDC VSC converter system.
Figure 2:
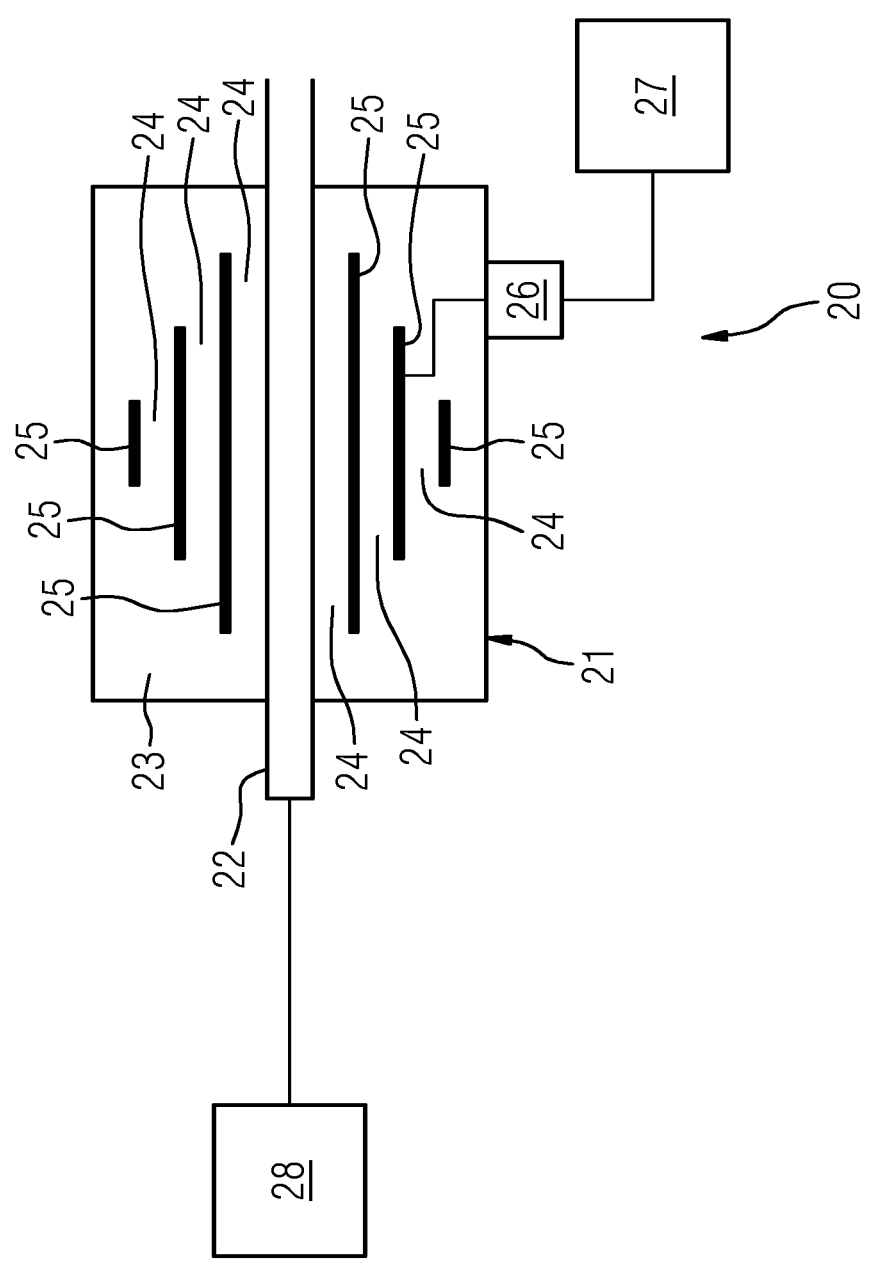
FIGS. 2 and 3 schematically show embodiments of a HVDC bushing arrangement according to the invention.

FIG. 2 shows a bushing arrangement 20 with an HVDC bushing 21. The bushing 21 comprises an inner conductor 22 extending along a longitudinal axis of the bushing 21, an insulating body 23 that surrounds the inner conductor 22 along its longitudinal direction. The insulating body 23 comprises insulating layers 24 configured from a synthetic material or paper that is impregnated with a resin, and electrically conductive control inserts 25 for field control being spaced apart from one another by means of the insulating layers 24.

The bushing 21 further comprises a test tap 26 connected to one of the control inserts 25. A monitoring means 27 comprise a signal generator to generate a voltage pulse which can be injected in the test tap 26. Moreover, the monitoring means 27 is configured to receive and process a corresponding response signal transmitted from the test tap 26. In accordance with the example shown in FIG. 2 the bushing 21 is a transformer bushing to be connected with an HVDC transformer 28.

Figure 3:
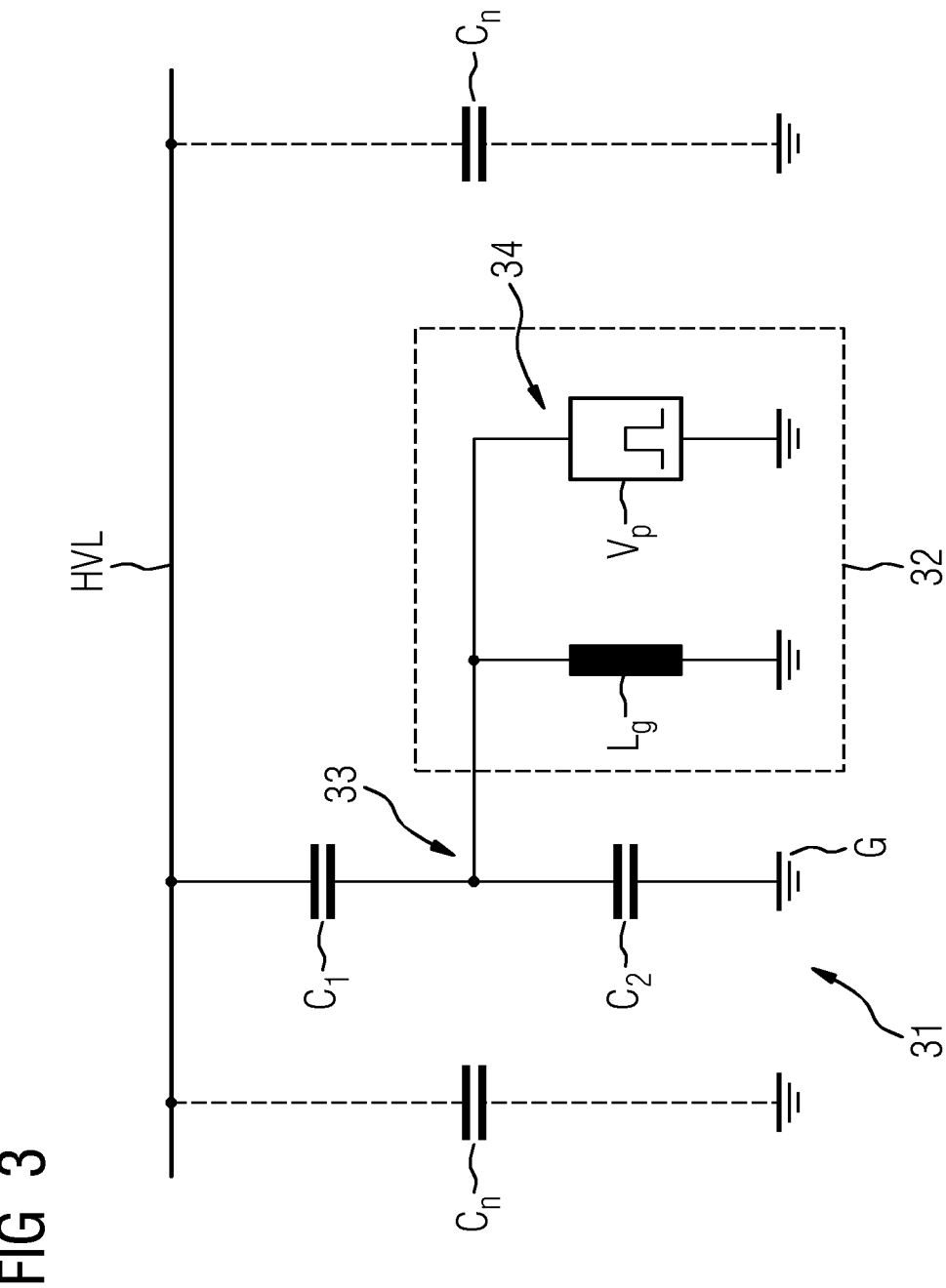

FIG. 3 illustrates an HVDC bushing arrangement 31 comprising a bushing represented by two capacitances C1 and C2 serially arranged between a high-voltage line HVL and ground G. In operation, the inner conductor of the bushing is on the voltage level of the line HVL whereas a housing of the bushing is grounded. A stray HV-ground capacitance of the network is represented by a capacitance Cn.

The bushing arrangement 31 further comprises monitoring means 34. The monitoring means 34 is equipped with a pulse generator Vp configured to generate and transmit a voltage and/or current pulse signal to a test tap 33. In parallel to the pulse generator 32 an induction element Lg is provided, with an induction value calculated in a way that the impedance between C1 and ground tends to infinite resp. is maximal (according to $f=1/(2*\pi*sqrt\ (Lg*C2)$), f denoting a pulse frequency). The current or voltage pulse signal can flow through C1 (the bushing main capacitance) and then close to ground via the stray capacitances of either the transformer or the HV network.

Since the current/voltage pulse flows on Cn capacitances, which may differ from case to case, the monitoring means preferably undergoes a pre-calibration before being used in operation (and from time to time an off-line calibration, e.g. every 5 y in case of network configuration changes).

The invention claimed is:

1. A high-voltage DC bushing arrangement, comprising:
a high-voltage DC bushing with a test or voltage tap;
a monitoring device configured to inject an electrical pulse signal, being at least one of a voltage pulse or a current pulse signal, via said tap and to detect and process a corresponding response signal; and
said monitoring device having a pulse generator configured to generate said electrical pulse signal and an induction element connected in parallel with said pulse generator.

2. The high-voltage DC bushing arrangement according to claim 1, wherein said electrical pulse signal has a predetermined frequency distribution.

3. The high-voltage DC bushing arrangement according to claim 1, wherein said electrical pulse signal comprises frequencies in a range between 30 Hz and 100 KHz.

4. The high-voltage DC bushing arrangement according to claim 1, wherein said inductance element has an induction value Lg chosen to render an impedance of a parallel circuit formed by said inductance element and a parallel capacitance of said bushing substantially maximal for a signal frequency of said electrical pulse signal.

5. The high-voltage DC bushing arrangement according to claim 1, wherein said bushing further comprises:
an inner conductor;
an insulating body disposed to surround said inner conductor along a longitudinal direction thereof;
insulating layers configured from a synthetic material or paper that is impregnated with a resin; and
electrically conductive control inserts for the control, wherein said control inserts being spaced apart from one another by respective said insulating layers.

6. The high-voltage DC bushing arrangement according to claim 5, wherein said tap is connected with one of said control inserts.

7. A method for operating a bushing arrangement, the method comprising the following steps:

providing a high-voltage DC bushing arrangement according to claim 1;
injecting a voltage and/or current pulse signal via the test or voltage tap of the high-voltage DC bushing;
detecting and processing a corresponding response signal;
comparing the response signal with a predetermined calibrated reference signal; and
providing a bushing status information based on said comparison.

8. The method according to claim 7, which comprises frequency analyzing the response signal.

9. The method according to claim 7, which comprises extracting resulting pulse frequency components from the response signal using a Fourier analysis, and deriving a related impedance for each frequency component.

10. A high-voltage DC transformer, comprising a high-voltage DC bushing arrangement according to claim 1.

11. A converter arrangement, comprising a converter with a first converter component located within a valve hall and a second converter component located outside said valve hall, and wherein said first and second converter components are electrically connected via at least one high-voltage DC bushing arrangement according to claim 1.

12. A high-voltage DC bushing arrangement, comprising:
a high-voltage DC bushing with a test or voltage tap; and
a monitoring device configured to inject an electrical pulse signal, being at least one of a voltage pulse or a current pulse signal, via said tap and to detect and process a corresponding response signal;
said monitoring device having a pulse generator configured to generate said electrical pulse signal and an induction element connected in parallel with said pulse generator;
said inductance element having an induction value Lg chosen to render an impedance of a parallel circuit formed by said inductance element and a parallel capacitance of said bushing substantially maximal for a signal frequency of said electrical pulse signal.

* * * * *